United States Patent
Yu et al.

(10) Patent No.: US 10,312,399 B2
(45) Date of Patent: Jun. 4, 2019

(54) PHOTODIODE WITH DECREASED DARK CURRENT AND METHOD FOR MANUFACTURING THE SAME

(71) Applicants: SK hynix Inc., Icheon (KR); Korea University Research and Business Foundation, Seoul (KR)

(72) Inventors: Hyun-Yong Yu, Seoul (KR); Hwan-Jun Zang, Seoul (KR)

(73) Assignees: SK HYNIX INC., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 15/913,840

(22) Filed: Mar. 6, 2018

(65) Prior Publication Data

US 2018/0254370 A1 Sep. 6, 2018

(30) Foreign Application Priority Data

Mar. 6, 2017 (KR) ........................ 10-2017-0028577

(51) Int. Cl.
*H01L 31/0352* (2006.01)
*H01L 31/028* (2006.01)
*H01L 31/113* (2006.01)

(52) U.S. Cl.
CPC .......... *H01L 31/113* (2013.01); *H01L 31/028* (2013.01); *H01L 31/035281* (2013.01)

(58) Field of Classification Search
CPC ................. H01L 31/113; H01L 31/028; H01L 31/035281
See application file for complete search history.

(56) References Cited

U.S. PATENT DOCUMENTS

| | | | | |
|---|---|---|---|---|
| 5,780,916 A | * | 7/1998 | Berger | H01L 31/1085 257/21 |
| 2012/0107983 A1 | * | 5/2012 | Choi | H01L 21/77 438/34 |
| 2015/0279907 A1 | * | 10/2015 | Sato | H01L 27/326 257/40 |
| 2018/0144936 A1 | * | 5/2018 | Cho | G03F 1/44 |

OTHER PUBLICATIONS

Hwan-Jun Zang et al., "Asymmetrically contacted germanium photodiode using a metal-interlayer-semiconductor-metal structure for extremely large dark current suppression", Optics Letters, Aug. 15, 2016, pp. 3686-3689, vol. 41, No. 16, Optical Society of America.

Hwan-Jun Zang et al., "Dark Current Suppression of Germanium Photodiode Using Metal-Interlayer-Semiconductor-Metal Structure with TiO2 interlayer", Meeting Abstracts MA2016-01, 2016, pp. 1-2, ECS—The Electrochemical Society.

* cited by examiner

*Primary Examiner* — Zandra V Smith
*Assistant Examiner* — Andre C Stevenson

(57) ABSTRACT

A photodiode having a reduced dark current includes a semiconductor layer, a first contact part, a second contact part, and an active region. The first contact part disposed in a first region of the semiconductor layer includes an interlayer and at least one metal layer. The second contact part disposed in a second region of the semiconductor layer includes at least one metal layer. The active region is disposed between the first contact part and the second contact part. The first contact part and the second contact part are arranged asymmetrical to each other.

13 Claims, 19 Drawing Sheets

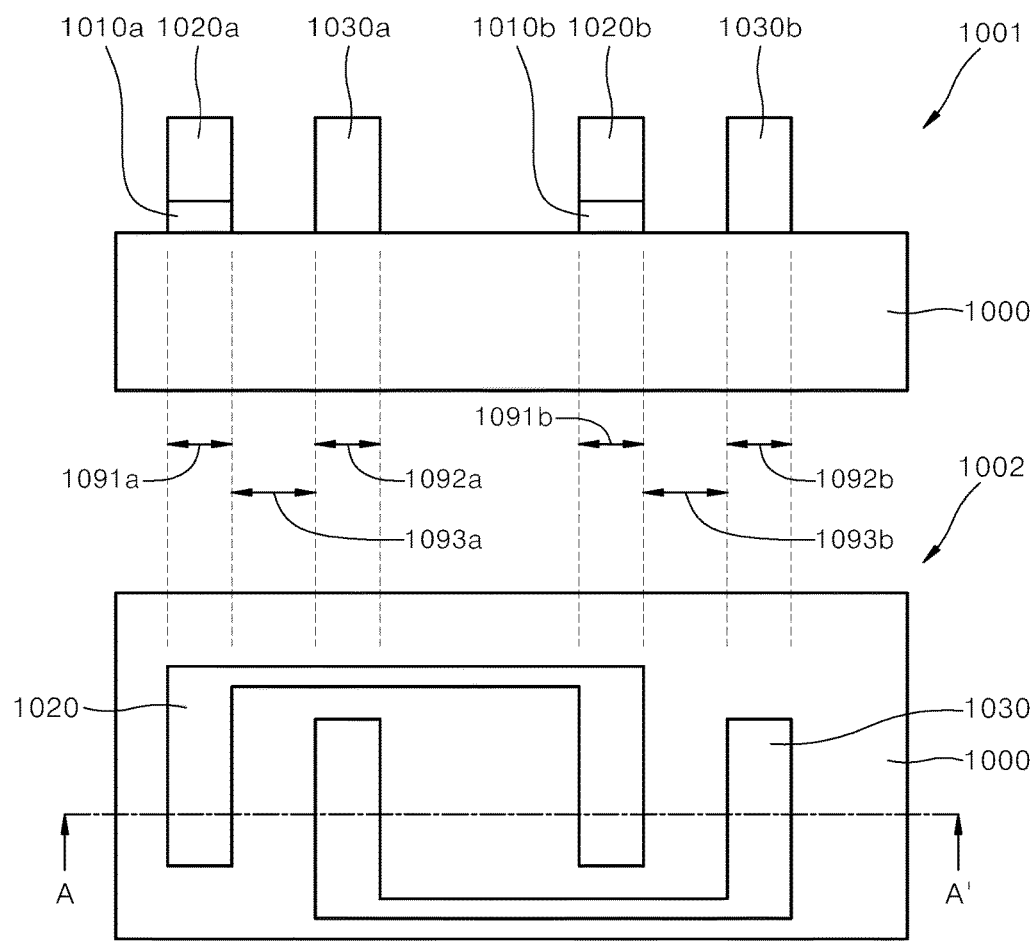

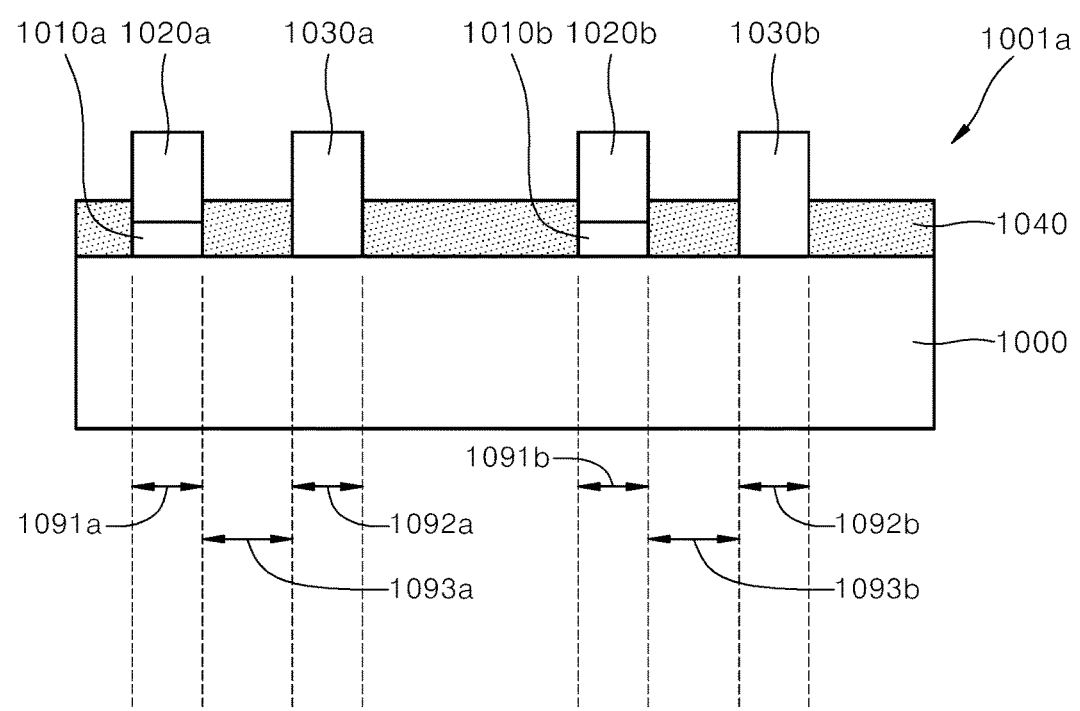

PHOTODIODE WITH DECREASED DARK CURRENT AND METHOD FOR MANUFACTURING THE SAME

CROSS-REFERENCE TO RELATED APPLICATIONS

This application claims the priority of Korean Patent Application No. 10-2017-0028577 filed on Mar. 6, 2017, in the Korean Intellectual Property Office, the disclosure of which is hereby incorporated by reference in its entirety.

BACKGROUND

1. Technical Field

The present disclosure relates to a photodiode with a decreased dark current and a method for manufacturing the same, and more particularly to a technology for reducing a dark current of a photodiode with a germanium (Ge) substrate.

2. Description of the Related Art

In an information society, semiconductors are essential elements for processing, storing, and converting information. A photodiode is a semiconductor device that converts an optical signal into an electrical signal. A photodiode may be disposed in an image sensor such as a Charge Coupled Device (CCD) or Complementary Metal Oxide Semiconductor (CMOS), and may convert received light into an electrical signal.

Meanwhile, removing a dark current increases performance of the photodiode. The dark current may be described as a signal or current measured in the absence of light energy on the photodiode, resulting in reduced accuracy of the photodiode. The dark current may cause noise in a pixel signal, such that performance of an image sensor having a photodiode with substantial dark current is deteriorated. Therefore, many developers and companies are conducting intensive research into technology for removing a dark current from the photodiode.

Although special chemical processing is performed on a substrate having a photodiode to remove a dark current, such chemical processing has difficulty in collecting photocharges. A technology for maintaining or improving performance of a photodiode while simultaneously reducing dark current of the photodiode, and a method for manufacturing the photodiode, will hereinafter be described.

SUMMARY

It is an object of the present disclosure to provide a technology for reducing a dark current in a photodiode.

It is an object of the present disclosure to provide a technology for reducing a dark current by inserting an interlayer into selected portions of an electrode layer of the photodiode.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a photodiode having a reduced dark current includes a semiconductor layer, a first contact part, a second contact part, and an active region. The first contact part disposed in a first region of the semiconductor layer includes an interlayer and at least one metal layer. The second contact part disposed in a second region of the semiconductor layer includes at least one metal layer. The active region is disposed between the first contact part and the second contact part. The first contact part and the second contact part are arranged asymmetrical to each other.

In accordance with another aspect of the present disclosure, a method for manufacturing a photodiode having a reduced dark current includes depositing an interlayer dielectric film over a semiconductor layer etching a first region from among the interlayer dielectric film, depositing an interlayer over the etched first region and the interlayer dielectric film, exposing the interlayer dielectric film by etching the interlayer other than the first region, etching a second region separated from the first region, from among the interlayer dielectric film, and depositing a first metal layer over the interlayer of the first region, and depositing a second metal layer over the semiconductor layer of the second region.

According to an exemplary embodiment of the present disclosure, photodiode performance can be improved by reducing a dark current of the photodiode.

Further, according to an exemplary embodiment of the present disclosure, photodiode performance can be improved by reducing a dark current by inserting an interlayer into some parts of an electrode layer of the photodiode.

It should be noted that effects of the present disclosure are not limited to those described above and other effects will be apparent to those skilled in the art from the following descriptions.

BRIEF DESCRIPTION OF DRAWINGS

FIG. 3 is a view illustrating a photodiode having a reduced dark current according to an embodiment of the present disclosure.

FIG. 4 is a view illustrating a photodiode having an interlayer dielectric film formed of an interlayer dielectric material according to an embodiment of the present disclosure.

DETAILED DESCRIPTION

Figure 1:
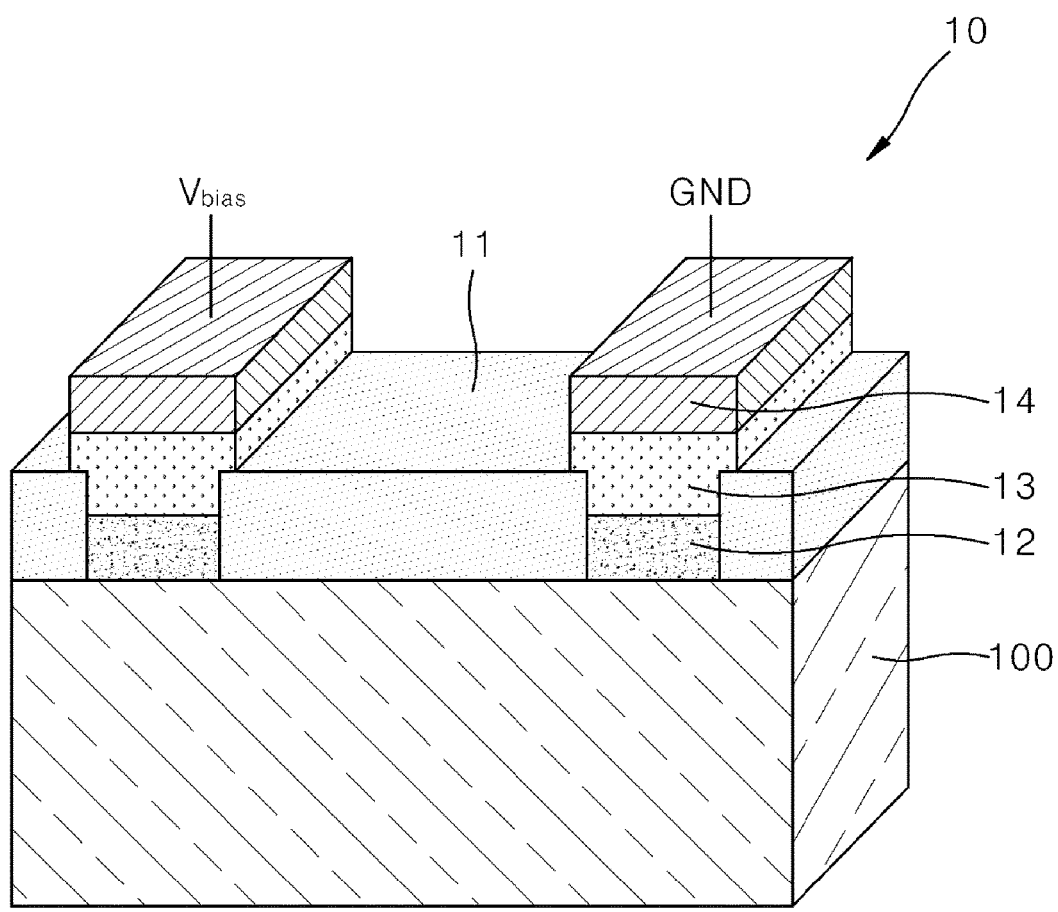
FIG. 1 is a view illustrating a Metal-Semiconductor-Metal (MSM) photodiode in which metal and semiconductor are arranged in an overlapping manner.

Embodiments are described in sufficient detail to enable those skilled in the art in the art to easily practice the technical idea of the present disclosure. Detailed descriptions of well known functions or configurations may be omitted so that the gist of the present disclosure is not obscured. Hereinafter, embodiments of the present disclosure will be described in detail with reference to the accompanying drawings. Throughout the drawings, like reference numerals refer to like elements.

The terms used in the present application are merely used to describe specific embodiments and are not intended to limit the present disclosure. Unless otherwise defined, all terms used herein, including technical or scientific terms, have the same meanings as understood by those skilled in the art.

A singular expression may include a plural expression unless otherwise stated in the context unless specially described. Terms defined in a generally used dictionary may be analyzed to have the same meaning as the context of the relevant art and may not be analyzed to have ideal meaning or excessively formal meaning unless clearly defined in the present application.

The embodiments of the present disclosure will hereinafter be described centering upon the photodiode. A photodiode may be constructed in various ways and is not limited to the specific embodiments of the present disclosure. For convenience of description, photodiode having two contacts are described. However, it should be understood that embodiments of the present disclosure are described in limited detail, and that embodiments of the present disclosure are not limited to the features in the following description.

FIG. 1 is a view illustrating a Metal-Semiconductor-Metal (MSM) photodiode 10 in which metal and semiconductor are arranged in an overlapping manner. For example, semiconductor layer 11 overlaps with metal layers of the electrodes. Referring to FIG. 1, the MSM photodiode 10 includes a $SiO_2$ layer 11 arranged on a germanium (Ge) wafer 100. The $SiO_2$ layer 11 is etched at electrode regions so that the electrodes are in direct contact with the underlying Ge substrate 100. Specifically, each electrode comprises a hole Schottky barrier layer 12 that is disposed directly on the surface of the Ge wafer 100 in the electrode region. A titanium (Ti) layer 13 and a gold (Au) layer 14 may be arranged over the hole Schottky barrier 12.

The germanium (Ge) MSM photodiode shown in FIG. 1 has a hole dark current that directly relates to the hole Schottky barrier height. In particular, the hole Schottky barrier height (SBH) is inversely proportional to dark current. In order to reduce the dark current, a large bandgap material bay be inserted into the hole Schottky barrier 12 or doping can be applied to the barrier 12, resulting in reduction of the hole dark current. However, inserting a large-bandgap material may cause resistance in collection of photocharges, resulting in a reduced photocurrent.

Figure 2A:
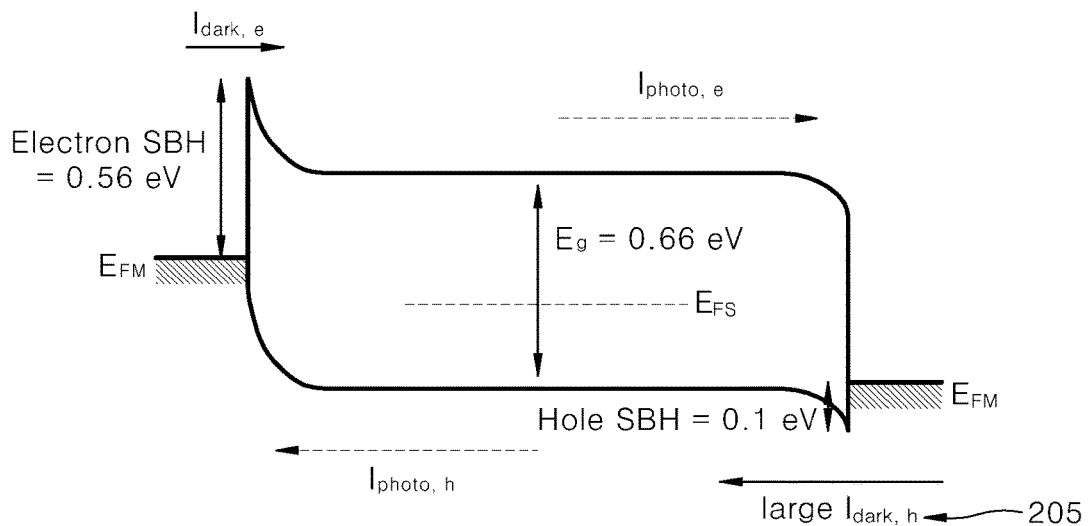
FIG. 2A and FIG. 2B are band diagrams illustrating current generated in a photodiode.
Figure 2B:
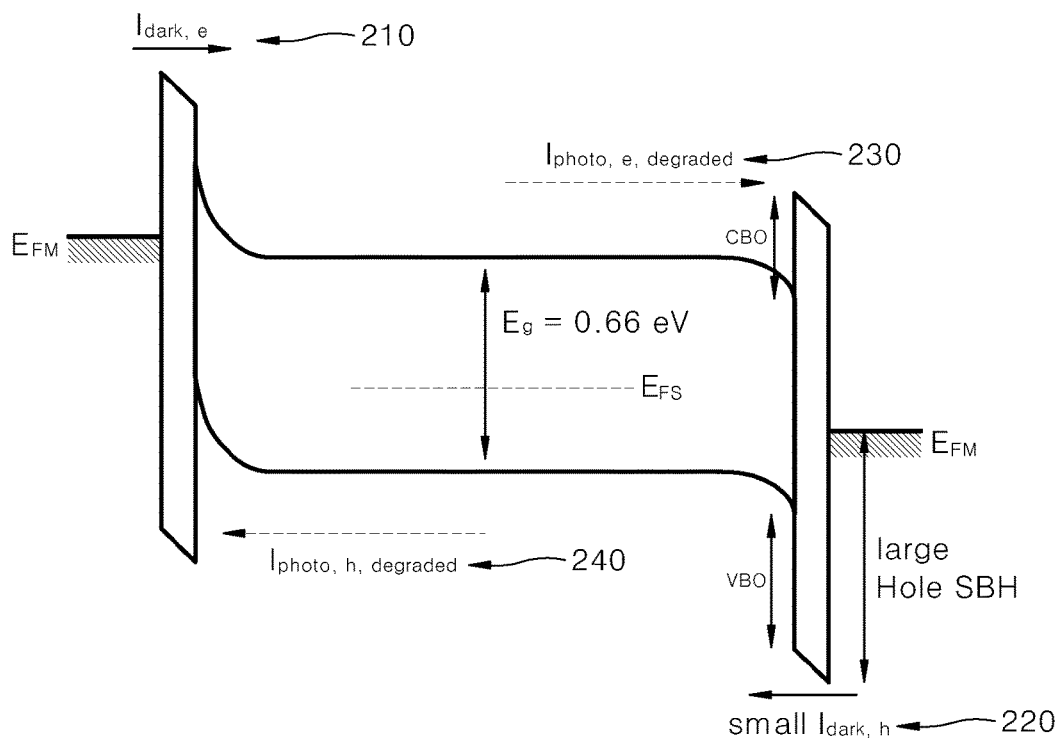

Referring to FIG. 2A, a band diagram illustrates that a Schottky barrier height (SBH) of a hole is relatively low at 0.56 eV. As a result, a dark current ($I_{dark,\,h}$) of the hole is large as denoted by 205. In contrast, the band diagram shown in FIG. 2B illustrates an example in which a Schottky barrier height (SBH) is relatively high as shown in FIG. 1. As a result, dark current in FIG. 2B is relatively low.

FIG. 2B illustrates an increased hole SBH that may be caused, for example, by a large-bandgap material as shown in FIG. 1. As a result, dark current electron flows designated as ($I_{dark,\,e}$) and ($I_{dark,\,h}$) are reduced as denoted by 210 and 220. In contrast, when the Schottky barrier height is increased, resistance is introduced into the photocurrent1, such that the photocurrent may decrease as shown in $I_{photo,\,e,\,degraded}$ 230 and $I_{photo,\,h,\,degraded}$ 240. In other words, while increasing the SBH of electrodes in an MSM photodiode can reduce dark current, it also reduces photocurrent, which degrades performance of the photodiode.

In addition, technology for reducing a dark current using doping has disadvantages. Doping processes are typically expensive and difficult to apply and add unacceptable cost and complexity to a process for manufacturing a photodiode.

In order to address the above-mentioned issues, a photodiode with a reduced dark current and a method for manufacturing the same will be described with reference to the attached drawings.

FIG. 3 is a view illustrating a photodiode having a reduced dark current according to an embodiment of the present disclosure. Referring to FIG. 3, view 1001 is a cross-sectional view taken along the line A-A' of view 1002, and 1002 is a top view of the photodiode. The photodiode may be classified into first regions 1091a and 1091b having first contact parts, which are connected to a cathode on the semiconductor layer 1000, and second regions 1092a and 1092b having second contact parts, which are connected to an anode. Accordingly, numbers 1091 and 1092 may refer to both first and second regions, and the respective first and second contact parts disposed within those regions. An active region 1093a may be disposed between the first region 1091a and the second region 1092a, and an active region 1093b may be disposed between the first region 1091b and the second region 1092b.

The active regions 1093a and 1093b may be defined by a doped portion of the substrate 1000. In some embodiments, the entire substrate 1000 is doped, so that an entire upper surface portion of the substrate 1000 is effectively an active region. In other embodiments, limited portions of the substrate are doped, such as the regions 1093a and 1093b that are disposed in spaces between anode and cathode contact parts.

In the embodiment shown in FIG. 3, the anode and cathode electrodes are offset from one another such that spaces between anode-cathode region pairs 1091a-1092a and 1091b-1092b are less than a space between second region 1092a and first region 1091b. The first contact parts and the second contact parts may have different structures from one another.

The first region 1091a may include an interlayer 1010a and a metal layer 1020a. The second region 1091b may include an interlayer 1010b and a metal layer 1020b. First region 1091a and second region 1091b may be electrically connected to each other. In other words, fingers of an interdigitated photodiode may be constructed as seen in view 1002.

In accordance with one embodiment of the present disclosure, the cathode electrode includes an interlayer material that reduces a conduction band offset (CBO) between the semiconductor layer 1000 and each of the interlayers (1010a, 1010b). In an embodiment, the interlayer material causes the CBO to be negligible, or zero. In other embodiments, the CBO is equal to or lower than 1.0 eV, 0.5 eV, 0.3 eV, 0.1 eV, or 0.01 eV. For example, in an embodiment in which the semiconductor layer 1000 is formed of germanium (Ge), the interlayer 1010a or 1010b may include a material such as $TiO_2$. In addition, the effect of reducing the dark current can be enhanced by adjusting thickness of the interlayers.

In FIG. 3, each of the metal layers (1020, 1030) may comprise one or more material layers. A material of each of the metal layers may be selected according to one or more material present in the interlayers (1010a, 1010b). When each of the interlayers (1010a, 1010b) is formed of $TiO_2$, each of the metal layers (1020, 1030) may be formed of titanium (Ti). Alternatively, a lower metal layer of each of the metal layers may be formed of a first metal such as titanium (Ti), and an upper metal layer of each of the metal layers is formed of a different metal such as gold (Au), so that each of the metal layers (1020, 1030) includes two separate metal layers.

In various embodiments, each of the metal layers may be selected from a group that includes gold (Au), silver (Ag), aluminum (Al), cobalt (Co), chromium (Cr), copper (Cu), gadolinium (Gd), hafnium (Hf), indium (In), iridium (Ir), magnesium (Mg), manganese (Mn), molybdenum (Mo), nickel (Ni), lead (Pb), palladium (Pd), platinum (Pt), rhodium (Rh), tantalum (Ta), titanium (Ti), tungsten (W), and zinc (Zn). In addition, a metal layer may be formed of an alloy of one or more materials contained in the above-mentioned group.

Alternatively, first metal layers disposed in the first regions (1091a, 1091b), e.g. metal layers 1020, and second metal layers disposed in the second regions (1092a, 1092b) e.g. metal layers 1030, may be formed of different constituent elements, or constituent materials of the metal layers and the other metal layers may be implemented with different compositions. In accordance with another embodiment of the present disclosure, the metal layer 1020 disposed in each of the first regions (1091a, 1091b) may be formed of titanium (Ti), and the other metal layer 1030 disposed in each of the second regions (1092a, 1092b) may be formed of gold (Au).

In an embodiment, an interlayer dielectric film formed of an interlayer dielectric material may be disposed over the semiconductor layer 1000, and the first regions (1091a, 1091b) and the second regions (1092a, 1092b) may then be etched.

FIG. 4 is a view illustrating a photodiode having an interlayer dielectric film 1040 formed of an interlayer dielectric material according to an embodiment of the present disclosure. FIG. 4 illustrates the interlayer dielectric film 1040 arranged over the exposed upper surface of Ge layer 1000. In one embodiment of the present disclosure, the interlayer dielectric film 1040 may be formed of $SiO_2$. The interlayer dielectric film 1040 may have a greater height than each of the interlayers (1010a, 1010b) so that the dielectric film overlaps with and completely covers sidewalls of the interlayers. The upper surface of interlayer dielectric film 1040 may be disposed below upper surfaces of each of the metal layers (1030a, 1030b) in the second regions (1092a, 1092b), so that metal layers 1030 are exposed above the surface of dielectric layer 1040. In addition, the interlayer dielectric film 1040 may be coated with an anti-reflective material.

In the embodiments shown in FIGS. 3 and 4, each of the first region 1091a equipped with the interlayer 1010a and the first region 1091b equipped with the interlayer 1010b may be referred to as a Metal-Insulator-Semiconductor (MIS) contact part. Each of the second regions (1092a, 1092b) may be referred to as a Metal-Semiconductor (MS) contact part.

Two contact parts may be have different constituent layers because the interlayer is disposed in only one of the contact parts.

In FIGS. 3 and 4, the CBO between the semiconductor layer 100 and each of the interlayers (1010a, 1010b) may be equal to or less than a predetermined value, and a Valence Band Offset (VBO) between the semiconductor layer 1000 and each of the interlayers (1010a, 1010b) may be equal to or higher than a predetermined value. For example, the VBO may be higher than about 2.9 eV, resulting in reduction of a dark current. The layers may be arranged so that the CBO is minimized. In embodiments, the CBO value is less than 1.0 eV, less than 0.5 eV, less than 0.3 eV, less than 0.1 eV, or less than 0.01 eV. Accordingly, in some embodiments, the CBO approaches zero. In an embodiment, when expressed with one significant digit, the CBO is 0.0, or zero.

Figure 5:
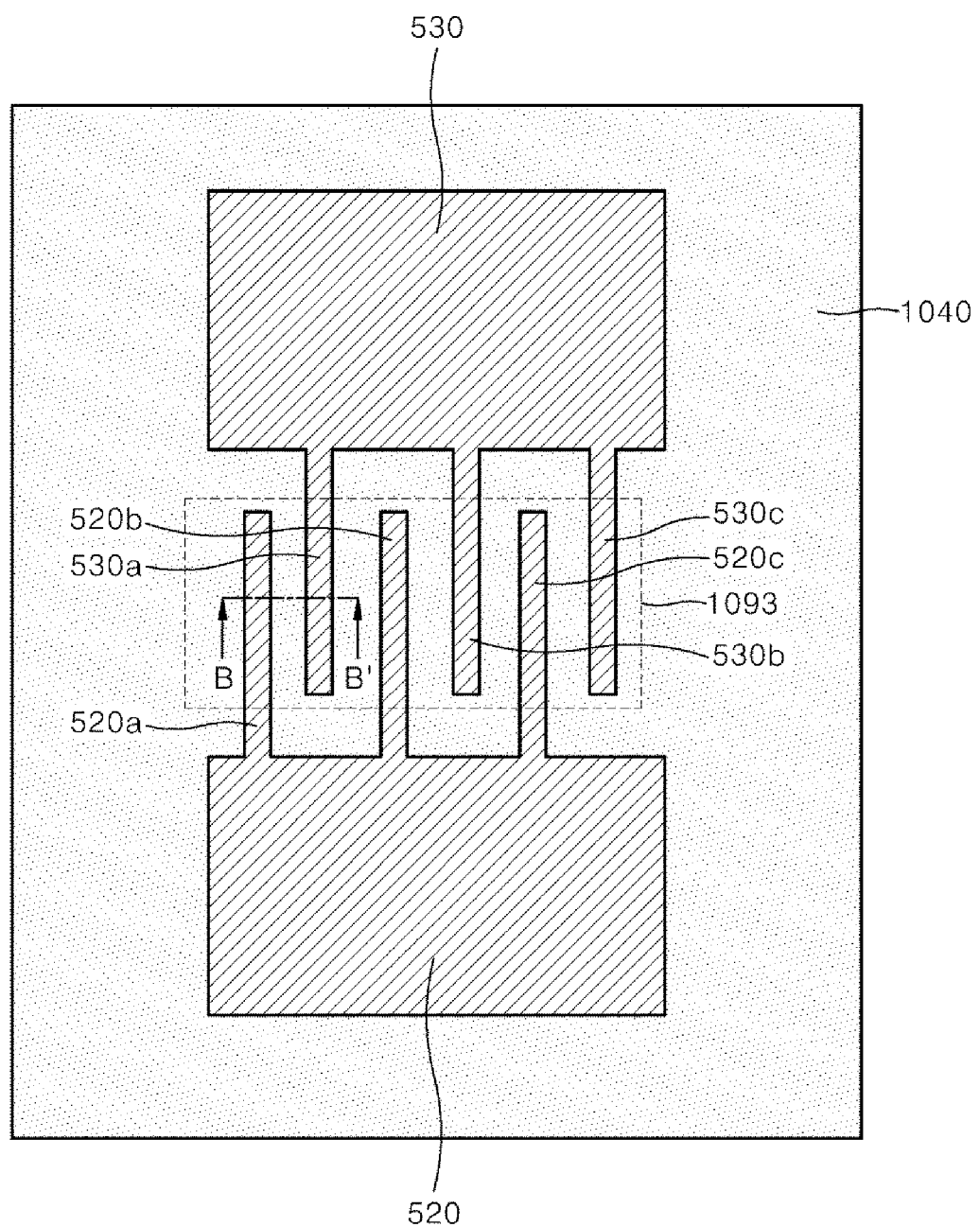
FIG. 5 is a view illustrating an interdigitated photodiode according to an embodiment of the present disclosure.

FIG. 5 is a view illustrating an interdigitated photodiode that embodies features of the photodiode described with respect to FIGS. 3 and 4. FIG. 5 illustrates an interlayer dielectric film 1040 surrounding an interdigitated photodiode. In one embodiment, the interlayer dielectric film 1040 may be formed of $SiO_2$. A first connection electrode part 520 and a second connection electrode part 530 may be disposed in an etched region of the interlayer dielectric film 1040.

The first connection electrode part 520 may be connected to a cathode, and may also be connected to one or more first contact parts (520a, 520b, 520c). The second connection electrode part 530 may be connected to an anode, and may also be connected to one or more second contact parts (530a, 530b, 530c).

An interlayer similar to interlayer 1010 discussed above may be disposed in each of the first contact parts (520a, 520b, 520c) used as the MIS contact parts. Each of the second contact parts (530a, 530b, 530c) acting as the MS contact parts may not include the interlayer. The overlap region 1093 of the first contact parts (520a, 520b, 520c) and the second contact parts (530a, 530b, 530c) may be an active region. The first contact parts (520a, 520b, 520c) and the second contact parts (530a, 530b, 530c) may be alternately arranged as shown in FIG. 5. In another embodiment, for convenience of fabrication, the first contact parts (520a, 520b, 520c) and the second contact parts (530a, 530b, 530c) may also be constructed as shown in FIG. 6.

Figure 6:
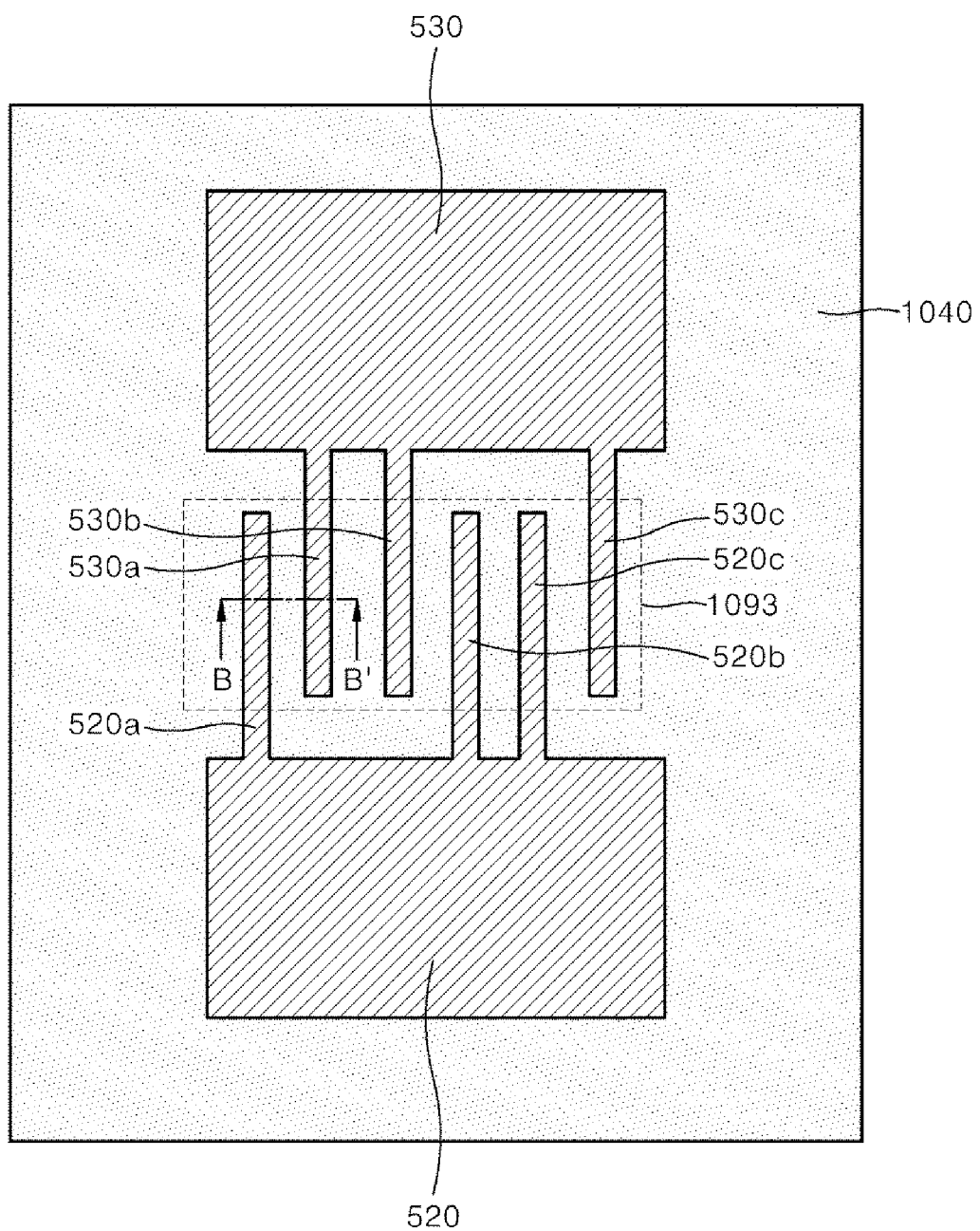
FIG. 6 is a view illustrating a photodiode in which contact parts of the same type are arranged close to one another according to an embodiment of the present disclosure.

FIG. 6 is a view illustrating a photodiode in which the same-type contact parts are arranged adjacent to one another according to an embodiment of the present disclosure. In other words, two first contact parts (520b, 520c) from among the first contact parts (520a, 520b, 520c) may be arranged adjacent to each other, and two second contact parts (530a, 530b) from among the second contact parts (530a, 530b, 530c) may be arranged adjacent to each other. As the number of interdigitated photodiodes increases, a spatial margin or process margin may be obtained in a process for depositing and etching one or more interlayers, when the same contact parts can be arranged adjacent to each other.

In FIGS. 5 and 6, the first connection electrode part 520 and at least one first contact part (520a, 520b, 520c) connected thereto may have different structures. In particular, the interlayer may not be disposed below the connection electrode part 520, and the interlayer may be disposed only in each of the first contact parts (520a, 520b, 520c).

For example, the photodiodes shown in FIGS. 5 and 6 may be constructed as follows. The photodiode may include a first connection electrode part 520 connected to the cathode on a semiconductor layer 1000 (as seen in FIGS. 3 and 4) and at least one first contact part (520a, 520b, 520c) connected to the first connection electrode part 520. The photodiode may further include a second connection electrode part 530 connected to the anode on the semiconductor layer 1000 and at least one second contact part (530a, 530b, 530c) connected to the second connection electrode part 530.

Each of the first contact parts (520a, 520b, 520c) may include the interlayer and at least one metal layer, and each of the second contact parts (530a, 530b, 530c) may include at least one metal layer. The above-mentioned interlayer may not be disposed in the first connection electrode part 520.

As described above with respect to FIG. 3, a photodiode may be classified into first regions, or first contact parts (1091a, 1091b) connected to a cathode on the semiconductor layer 1000, and second regions, or second contact parts (1092a, 1092b), connected to an anode. The active region 1093a is disposed between the first region 1091a and the second region 1092a, and the active region 1093b is disposed between the first region 1091b and the second region 1092b. The first contact parts and the second contact parts may have different layer structures.

Figure 7:
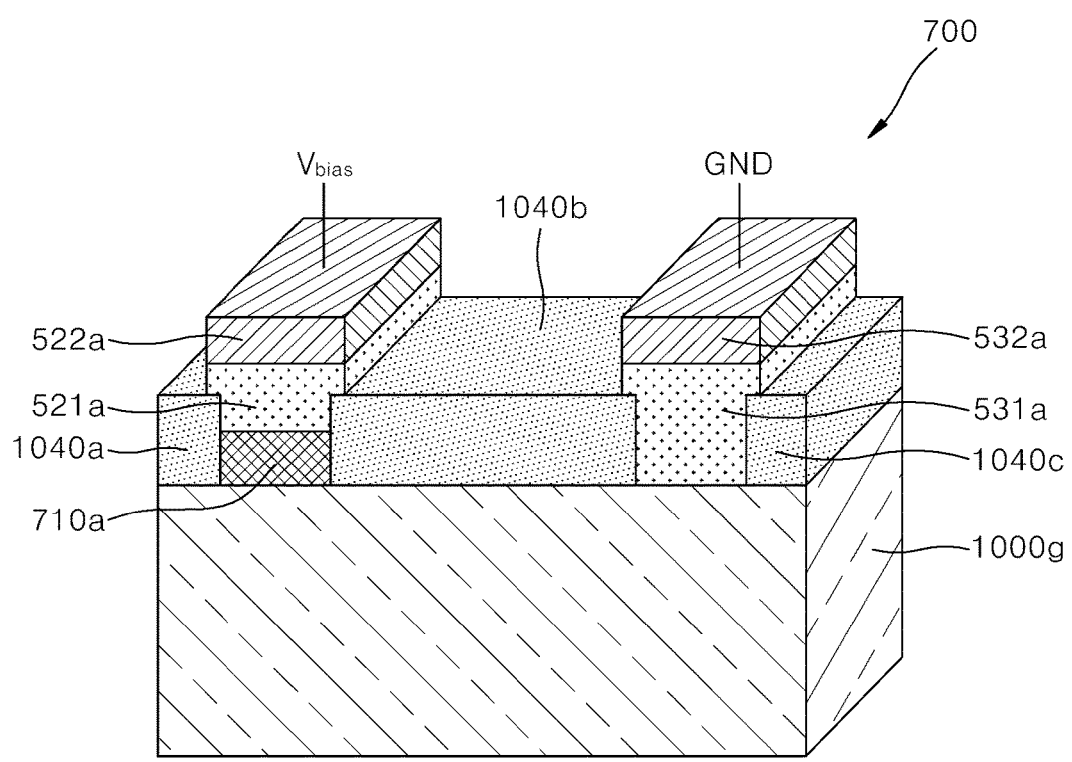
FIG. 7 is a view illustrating a Metal-Insulator-Semiconductor (MIS) photodiode according to an embodiment of the present disclosure.

FIG. 7 is a view illustrating a Metal-Insulator-Semiconductor (MIS) photodiode 700 according to an embodiment of the present disclosure. The view of MIS photodiode 700 illustrated in FIG. 7 is a cross-sectional view taken along line B-B' of FIGS. 5 and 6.

In the MIS photodiode 700, the semiconductor layer 1000g may be formed of germanium (Ge). A cathode of the MSM photodiode 700 may include a Metal-Insulator-Semiconductor (MIS) structure formed of $TiO_2$.

In more detail, the $SiO_2$ layers (1040a, 1040b, 1040c), each of which is an interlayer dielectric film, may be disposed on the germanium (Ge) semiconductor layer 1000g which is a Ge wafer, and $TiO_2$ may be formed as an interlayer material 710a in the cathode region. When the $TiO_2$ interlayer is present as shown in FIG. 7, dark current can be reduced.

In an embodiment in which a conduction band offset (CBO) between a $TiO_2$ material of interlayer 710a and the germanium (Ge) material of substrate 1000g is zero, photocharges may be effectively collected without causing resistance. The hole Schottky barrier is effectively increased due to large-bandgap characteristics of the $TiO_2$ material, resulting in reduction of a dark current. In addition, fabrication simplicity can be maintained by not applying a doping process. A process for inserting the $TiO_2$ interlayer 710a shown in FIG. 7 will hereinafter be described.

Figure 8:
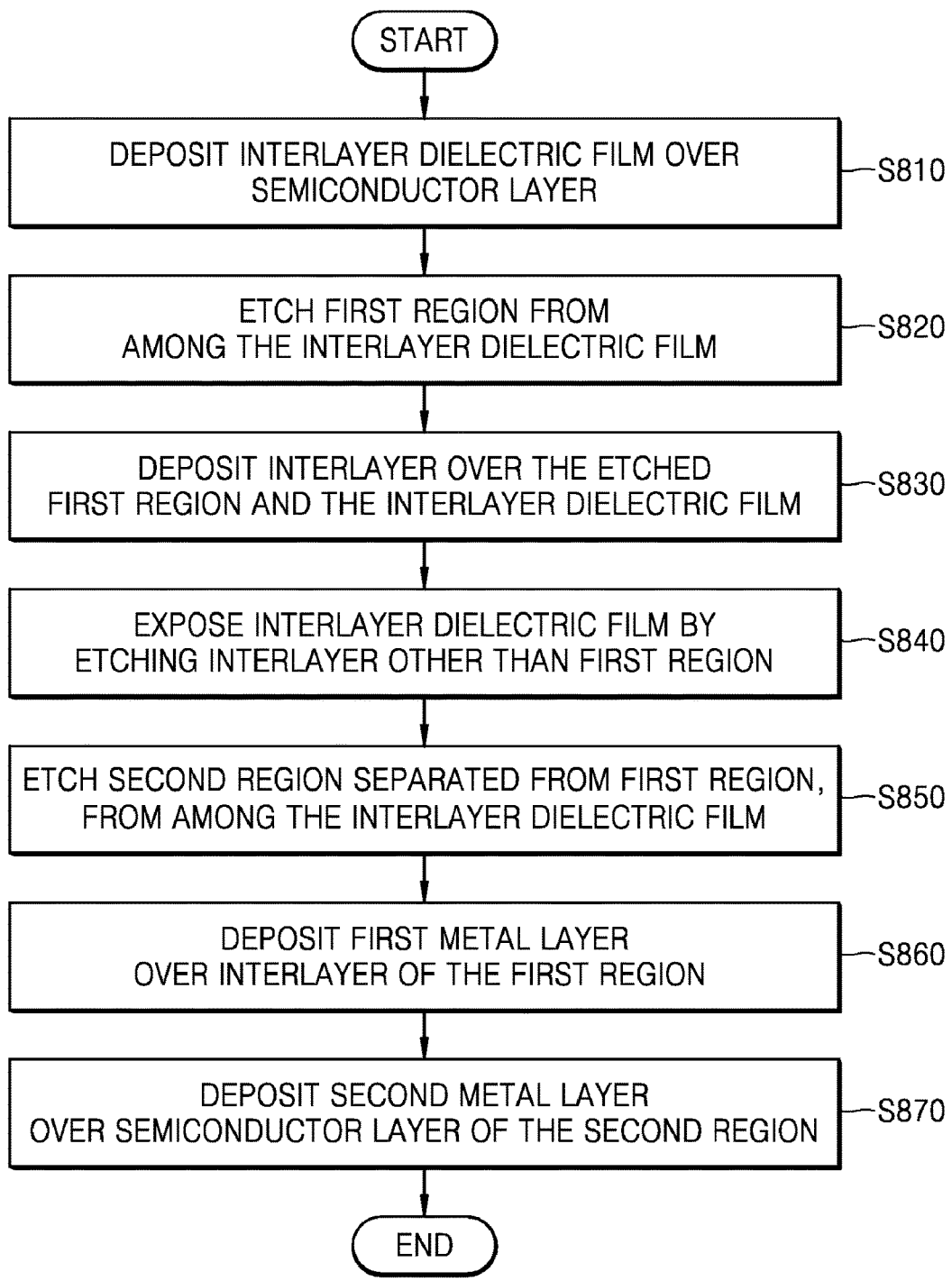
FIG. 8 is a flowchart illustrating a process for manufacturing a photodiode having a reduced dark current according to an embodiment of the present disclosure.

FIG. 8 is a flowchart illustrating a process for manufacturing a photodiode having a reduced dark current according to an embodiment of the present disclosure.

Referring to FIG. 8, an interlayer dielectric film may be deposited over a semiconductor layer (S810). A first region the interlayer dielectric film may be etched (S820). The first region may refer to a region in which the interlayer will be disposed and the above-mentioned first MIS contact parts are disposed. The etching process of S820 may be a wet etching process.

An interlayer material such as $TiO_2$ may be deposited over the etched first region and the interlayer dielectric film (S830) using, for example, Atomic Layer Deposition (ALD). Although embodiments of the present disclosure use the specific example of $TiO_2$ as the interlayer material, in other embodiments, other materials with a low CBO value for a substrate interface may be used. In such embodiments, substrate and interlayer materials may be selected to minimize the CBO value at the interface. As an example of the deposition material, a material for allowing the CBO of the semiconductor layer to be low or zero may be used as the deposition material. A deposition process may be performed in a manner that the above exemplary material constructs the interlayer.

The interlayer other than the first region may be removed to expose the interlayer dielectric film (S840). In an embodiment, portions of the interlayer material that are deposited over the upper surface of dielectric film 1040 are removed by a polishing process such as a chemical mechanical polishing process (CMP). In another embodiment, the interlayer may be removed by a dry-etch process.

The second region of the interlayer dielectric film separated from the first region may be etched (S850). In an embodiment, the second region may be wet-etched. The second region may refer to a region in which a metal material is deposited directly on the surface of the substrate material without any intervening interlayer material.

Thereafter, a first metal layer may be selectively deposited over the interlayer material in the first region (S860), and a second metal layer may be deposited over the semiconductor layer exposed in the second region (S870). When the same metal material is deposited over the first region and the second region, the steps S860 and S870 may be performed at the same time. In other words, in an embodiment in which different materials are used for anode and cathode electrodes, the different materials are deposited in separate processes. On the other hand, when both electrodes include the same material, it may be applied in a single deposition process. Persons of skill in the art will recognize that the metal layers may be formed using a variety of processes, including selective and bulk deposition and removal.

Figure 9:
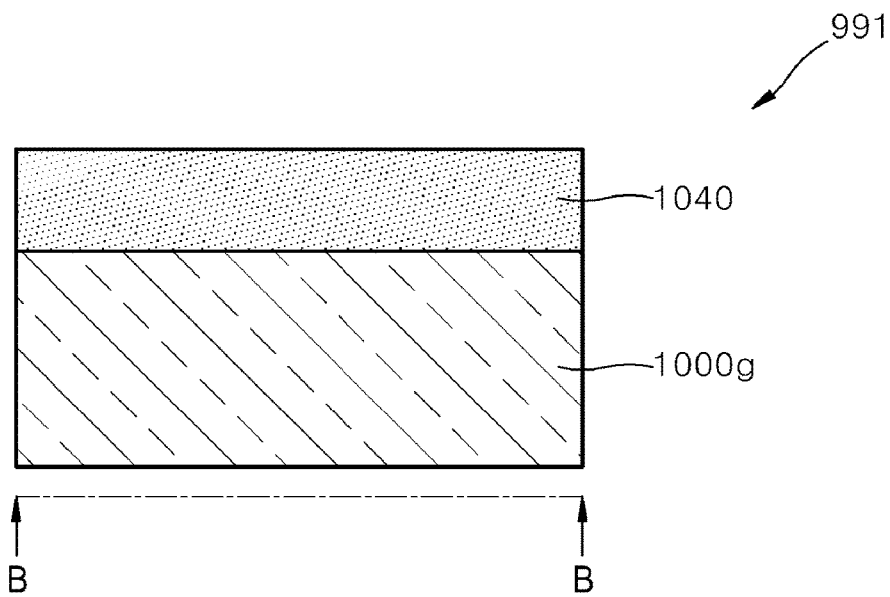
FIGS. 9 to 13 are conceptual diagrams illustrating processes for creating a MIS photodiode according to an embodiment of the present disclosure.

FIGS. 9 to 13 illustrate processes for forming an MIS photodiode according to an embodiment of the present disclosure. The fabrication process of FIG. 8 will hereinafter be described with reference to FIGS. 9 to 13. FIG. 9, illustrates a $SiO_2$ layer 1040 deposited over a Ge wafer 1000g, as disclosed in step S810 of FIG. 8. Thickness of the $SiO_2$ layer according to one embodiment may be 100 nm, and the $SiO_2$ layer may be deposited, for example, using e-beam evaporator or sputtering process.

Figure 10:
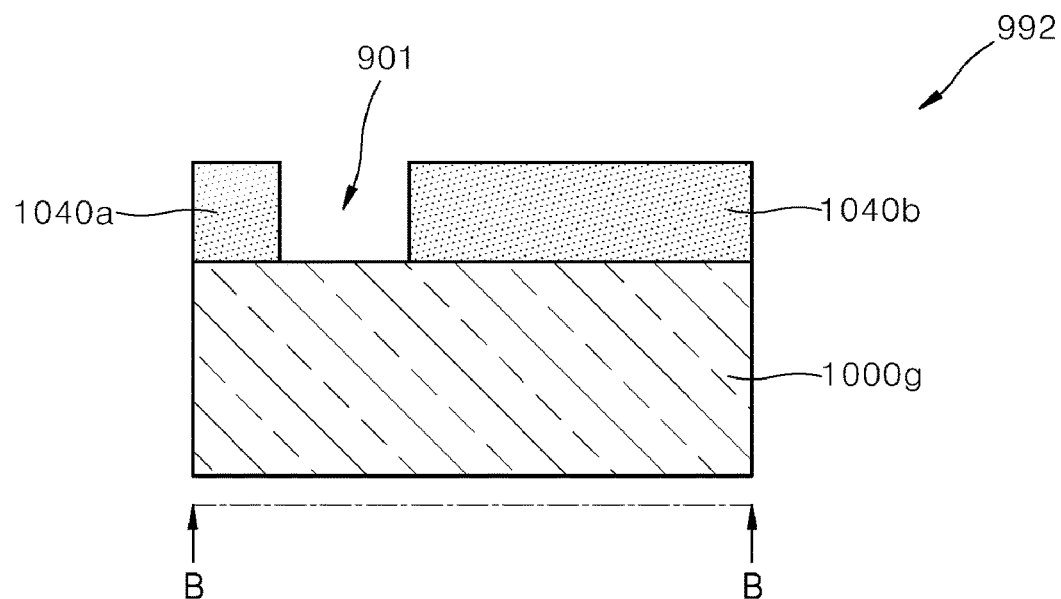

As shown in FIG. 10, a photolithography process may be performed on the deposited $SiO_2$ layer 1040 to etch the $SiO_2$ layer, thereby forming an cathode MIS contact region 901, as explained with respect to step S820 of FIG. 8. The etching may be a wet etching process performed using a 1:25 diluted HF (hydrogen fluoride) solution. After etching, a portion of the Ge wafer 1000g may be exposed as shown in region 901.

Figure 11:
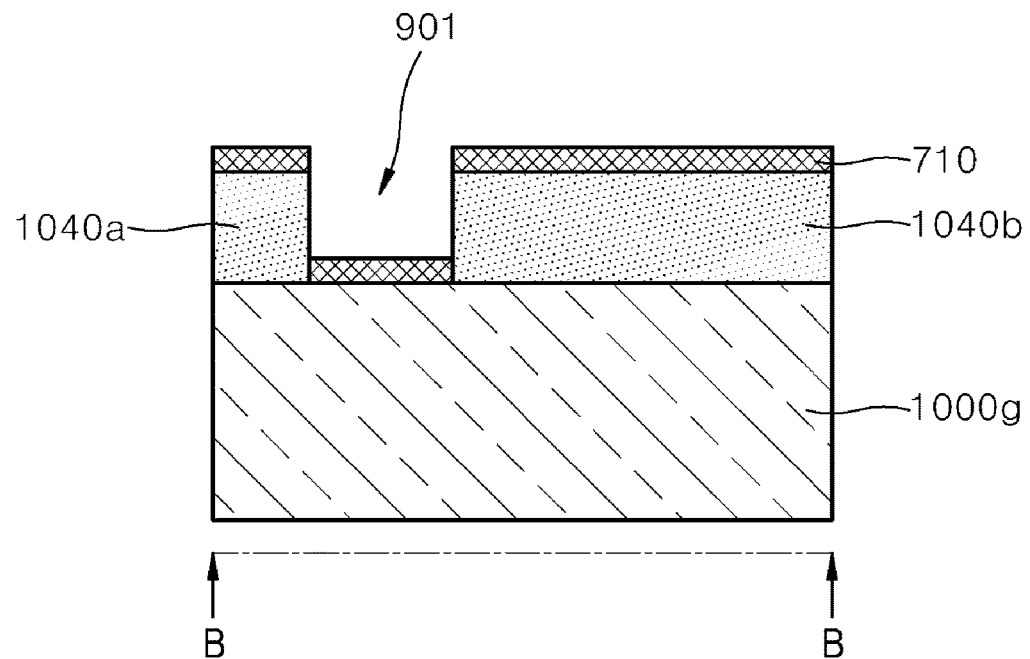

As an example of step S830 of FIG. 8, a $TiO_2$ layer 710 may be deposited over all exposed surfaces, as shown in FIG. 11. As an example of the deposition process, the $TiO_2$ layer may be deposited using atomic layer deposition (ALD). In an embodiment, the deposition process may be performed at a temperature of 250° C.

Figure 12:
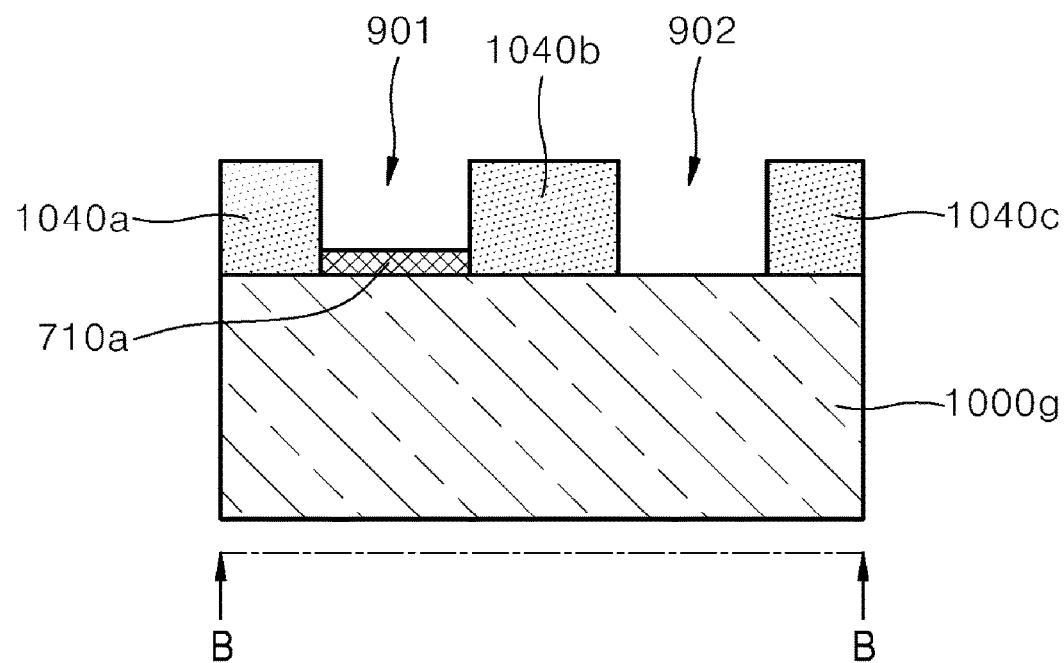

As seen in FIG. 12, portions of $TiO_2$ layer 710 are removed from upper surfaces of dielectric layer 1040c as explained with respect to S840. In addition, an etching process is performed to remove a portion of dielectric film 1040c, thereby exposing an upper surface of substrate 1000g as described with respect to S850 of FIG. 8. In an embodiment, SiO$_2$ and TiO$_2$ materials of respective dielectric film 1040b and interlayer material 710 may be plasma-etched to form MS contact region 902 acting as the anode region. In an embodiment, the TiO$_2$ layer 710 is removed from upper surfaces of film 1040b, thereby exposing film 1040c, while the TiO$_2$ layer 710a remains in the MIS contact region 901, which is the cathode region. The TiO$_2$ layer remaining on dielectric film 1040b may be dry-etched using SF$_6$ (sulfur hexafluoride), or removed by CMP. Thereafter, for etching of the MS contact region 902 acting as the second region in the remaining SiO$_2$ layer, the wet etching process may be performed using the HF solution as described above.

Figure 13:
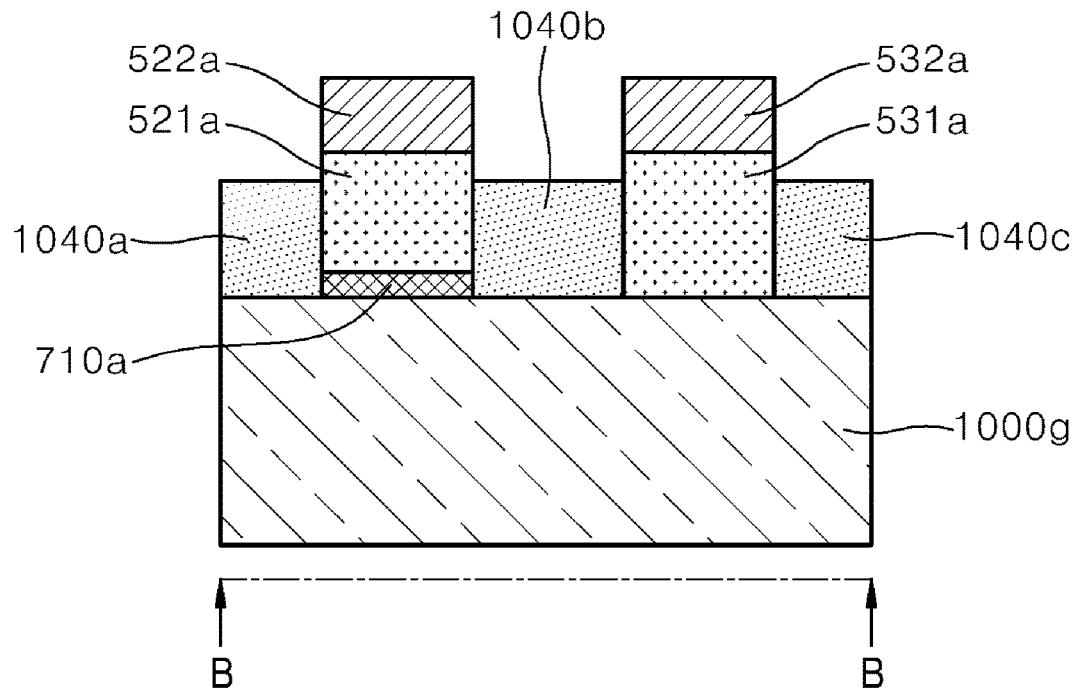

FIG. 13 illustrates an example of S860 and S870 of FIG. 8. In FIG. 13, the MIS contact region 901 acting as the cathode region in FIG. 12 and the MS contact region 902 acting as the anode region in FIG. 12 are filled by depositing one or more electrode metal in the respective spaces. In an embodiment in which a plurality of electrode metal materials are present, each metal material may be deposited in a discrete layer.

For example, as seen in FIG. 13, each of a first layer 521a and a second layer 522a may be the cathode electrode, and each of a first layer 531a and a second layer 532a may be the anode electrode. In this case, the first layers (521a, 531a) of the respective electrodes may be formed of titanium (Ti) and the second layers (522a, 532a) of the respective electrodes may be formed of gold (Au).

If an interlayer such as a TiO$_2$ layer is disposed only in the cathode portion of the photodiode through the processes of FIGS. 8 to 13, holes or electrons generated by photons striking the photodiode may be collected without causing a substantial amount of resistance.

Figure 14:
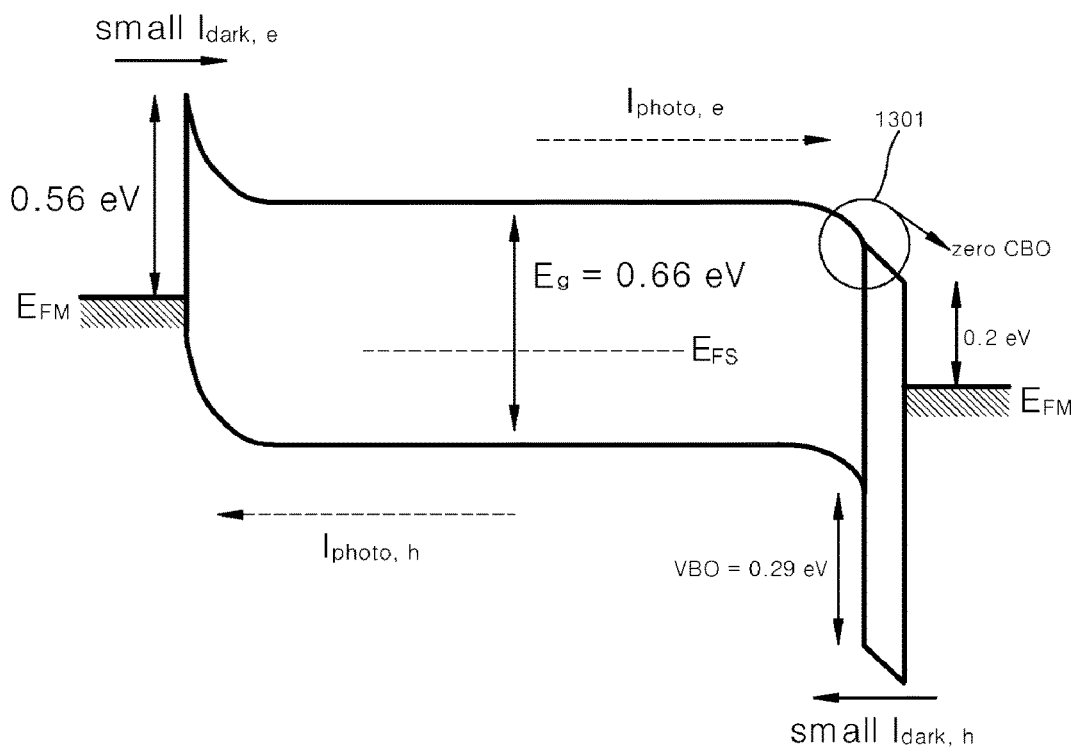
FIG. 14 is a band diagram illustrating flow of photocharges in a MIS photodiode according to an embodiment of the present disclosure.

FIG. 14 is a band diagram illustrating flow of photocharges in an MIS photodiode according to an embodiment of the present disclosure. The concept of FIG. 14 will hereinafter be described in comparison to the band diagrams of FIG. 2. As seen at 1301 of FIG. 14, the conduction band offset (CBO) of TiO$_2$ and germanium (Ge) may be zero due to the presence of the inserted interlayer, so that photocharges can be collected without causing tunneling resistance. That is, photocharges can be effectively collected without resistance losses.

In an embodiment that includes the MIS structure in which the TiO$_2$ material having a large bandgap is inserted as the interlayer, the hole Schottky barrier of the cathode is greatly improved, resulting in reduction of a hole dark current of a MSM photodiode with a germanium substrate. Finally, a doping process is not performed in the process described with respect to FIGS. 8 to 13, such that the technological advantage of fabrication simplicity of the MSM photodiode can be maintained.

In the process of FIGS. 8 to 13, the cathode region 901 may have a Metal-Insulator-Semiconductor (MIS) contact structure, and the anode region 902 may have a Metal-Semiconductor (MS) contact structure.

The region 1040b between two contacts may be an active region. In an embodiment, one or more of region 1040b and SiO$_2$ regions (1040a, 1040c) may be coated with an antireflective coating. In the active region 1040b, a photocurrent caused by incident light may flow between the MIS-type contact and the MS-type contact The incident light may be, for example, infrared light. In one embodiment, the infrared light has a wavelength of λ=1.55 um. However, embodiments are not limited to this example—in other embodiments, the infrared light may be a wavelength in a communication band such as the C band, S band or L band, or another wavelength.

The extent of the reduction of the dark current may be changed according to the height of the interlayer 710a according to various embodiments. A detailed description thereof will hereinafter be described.

Figure 15:
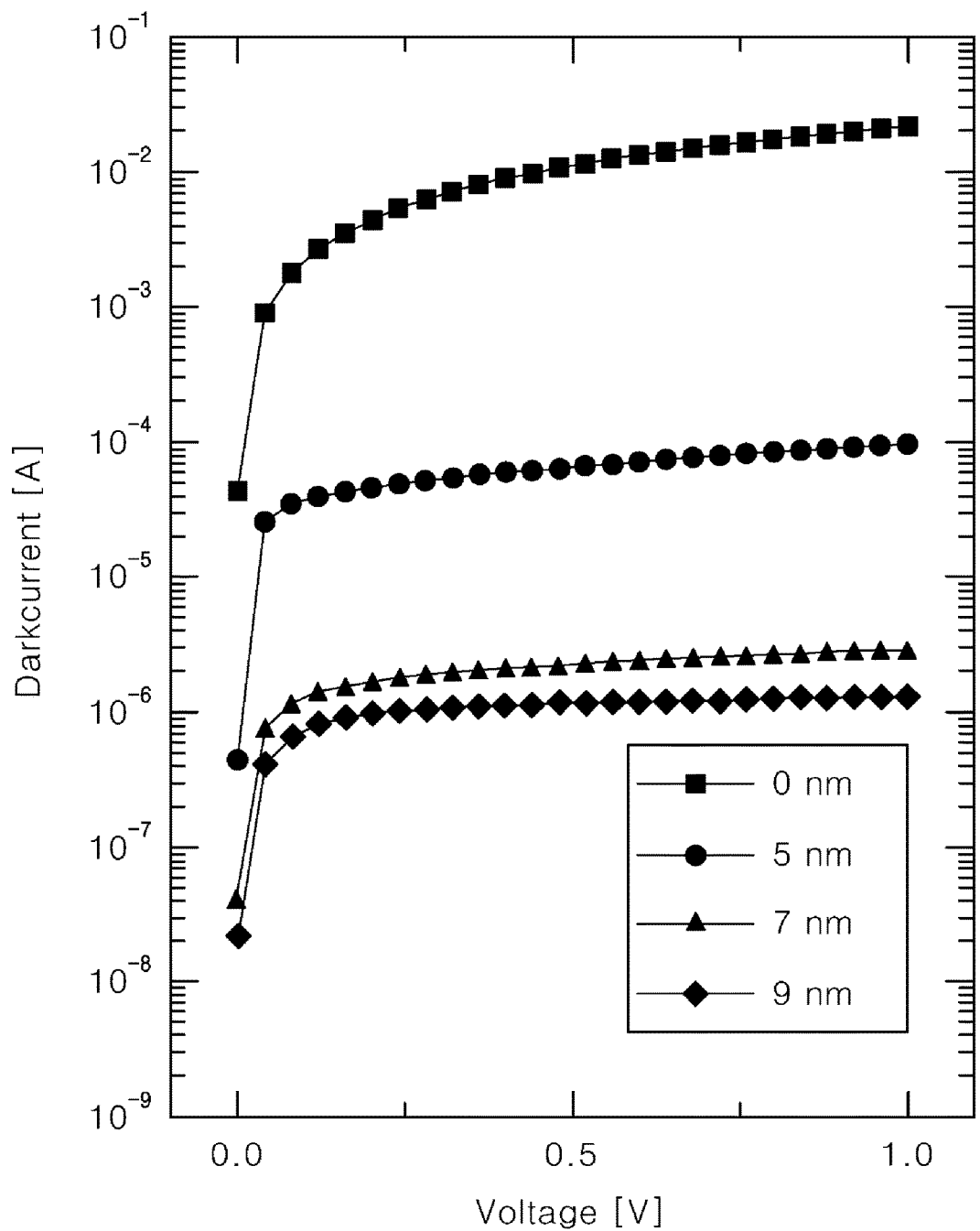
FIGS. 15 and 16 illustrate the magnitude of a dark current according to thickness of an interlayer according to an embodiment of the present disclosure.
Figure 16:
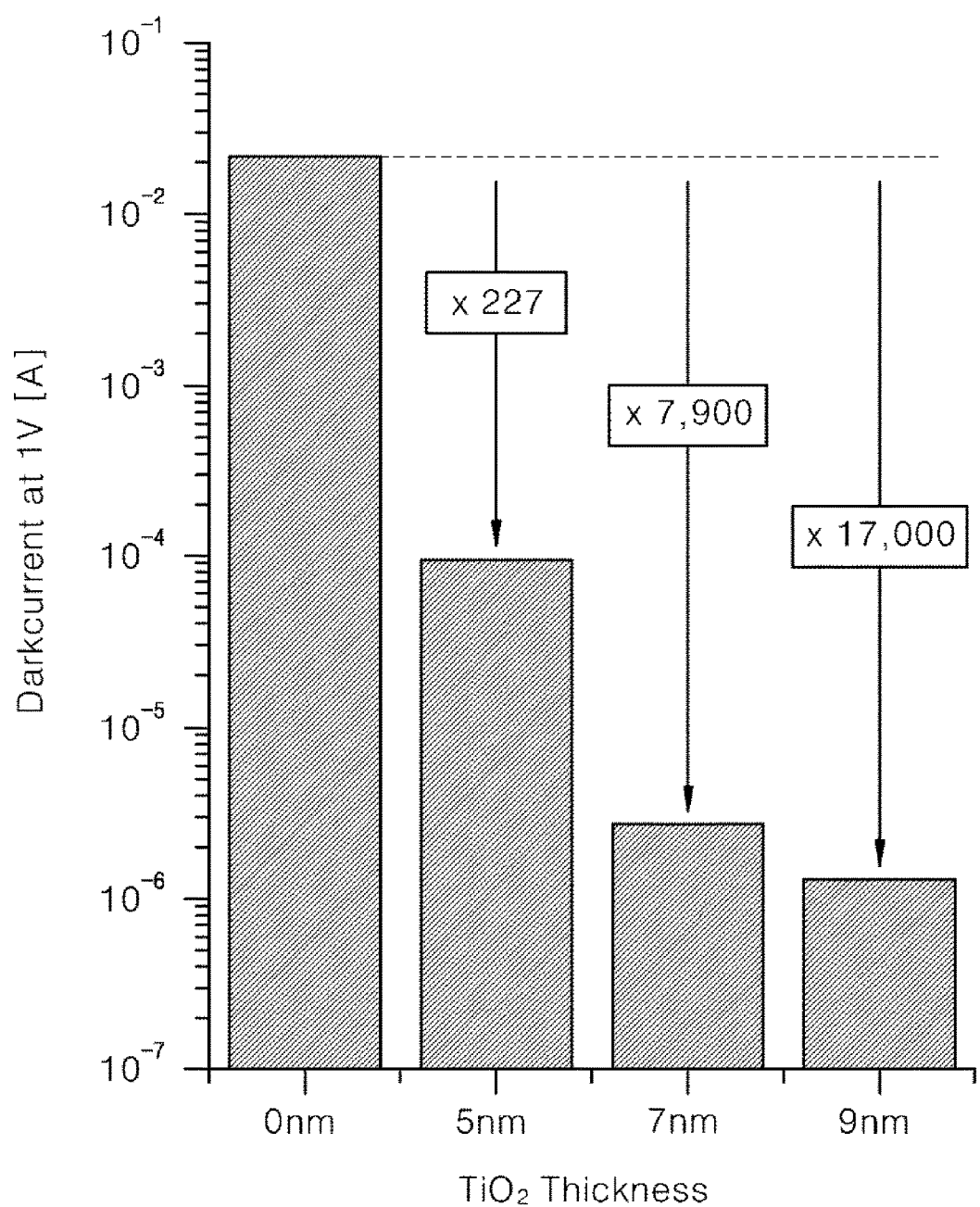

FIGS. 15 and 16 are graphs illustrating the magnitude of a dark current according to thickness of the interlayer according to an embodiment of the present disclosure. FIGS. 15 and 16 illustrate graphs based on embodiments in which TiO$_2$ is included in the interlayer.

FIG. 15 illustrates I-V correlation graphs at 0 nm, 5 nm, 7 nm and 9 nm. Here, 0 nm denotes the absence of the interlayer formed of TiO$_2$, 5 nm denotes that the interlayer has thickness of 5 nm, 7 nm denotes that the interlayer has thickness of 7 nm, and 9 nm denotes that the interlayer has thickness of 9 nm. If the TiO$_2$ material is disposed as the interlayer, it can be recognized that the dark current is reduced according to thickness of the TiO$_2$ interlayer.

FIG. 16 shows a reduction of the dark current at 1V. A detailed description thereof is as follows.

When the first structure having no TiO$_2$ (TiO$_2$ thickness=0 nm) is compared with the second structure with a 5 nm interlayer formed of TiO$_2$, it can be recognized that the dark current decreases by 227 times compared to the first structure having no interlayer.

When the first structure having no TiO$_2$ (TiO$_2$ thickness=0 nm) is compared with the structure having TiO$_2$ thickness of 7 nm, it can be recognized that the dark current decreases by 7,900 times compared to the first structure having no interlayer.

Likewise, when the first structure having no TiO$_2$ (TiO$_2$ thickness=0 nm) is compared with the structure having TiO$_2$ thickness of 9 nm, it can be recognized that the dark current according to the embodiment decreases by 17,000 times compared to the first structure having no interlayer.

Therefore, an interlayer of an embodiment of the present disclosure may have a thickness of 5 nm to 9 nm. Of course, the interlayer may be formed to have various thicknesses in various embodiments in consideration of characteristics of the semiconductor layer, an objective function of the photodiode, and a difference in constituent materials of the interlayer.

Figure 17:
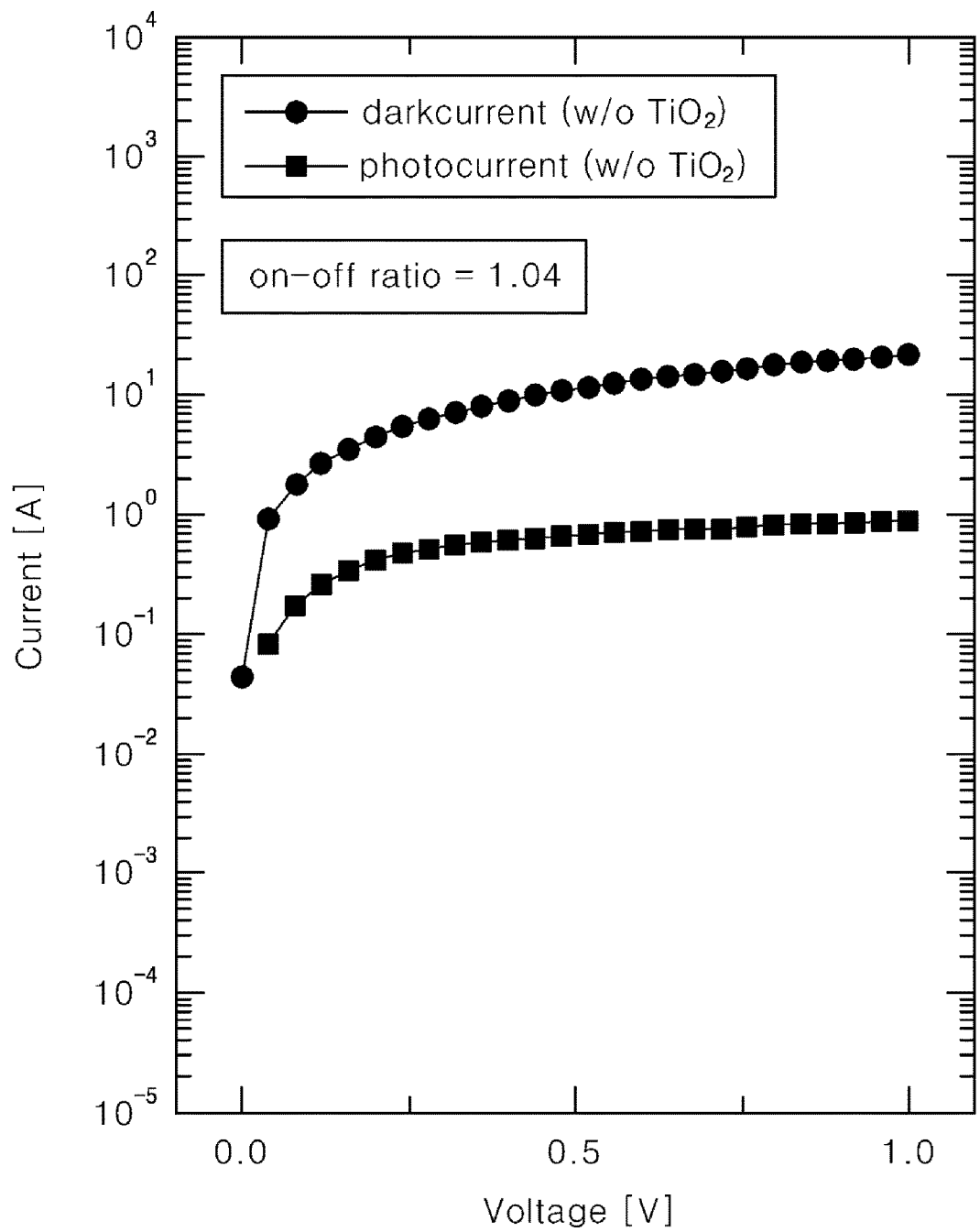
FIGS. 17 to 20 illustrate differences in flow between a dark current and a photocurrent according to interlayer thickness.

FIGS. 17 to 20 are graphs illustrating a difference in flow between a dark current and a photocurrent according to the interlayer. FIG. 17 shows electrical characteristics of emitted light emitted from a laser having a wavelength of 1.55 μm. FIGS. 17 to 20 show graphs based on embodiments in which the interlayer is formed of TiO$_2$.

FIG. 17 shows characteristics of the dark current and the photocurrent for a structure having no interlayer.

Figure 18:
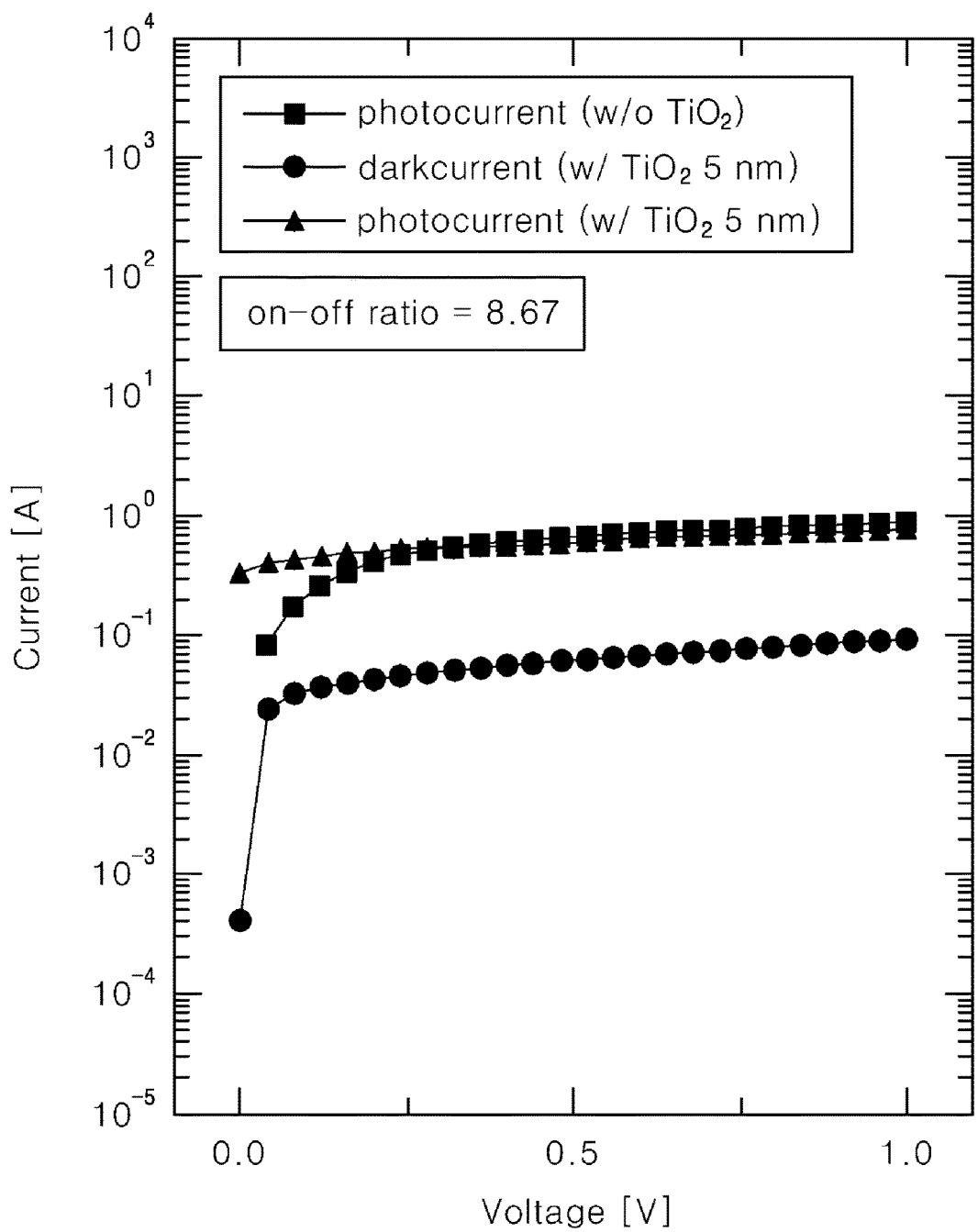
Figure 19:
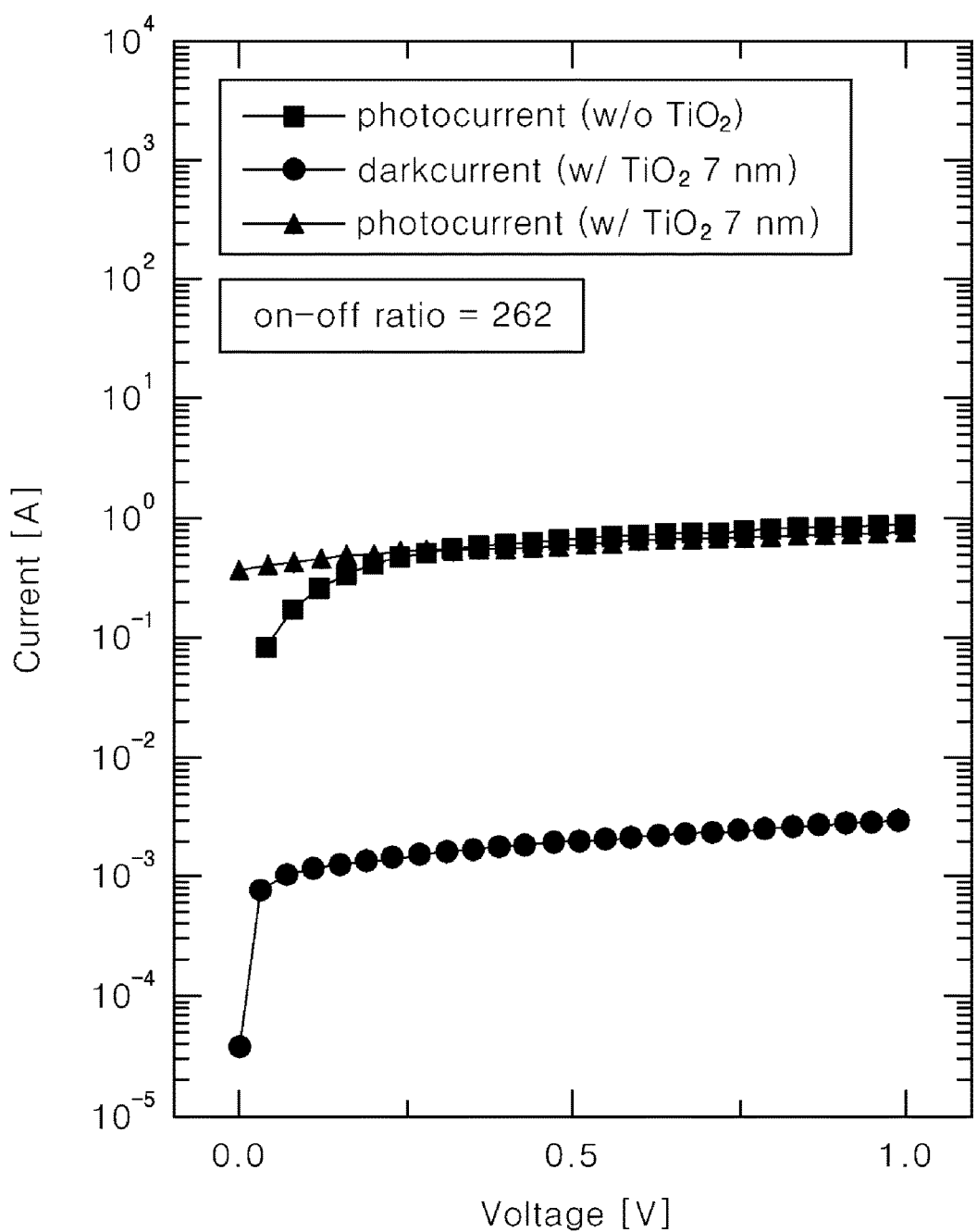
Figure 20:
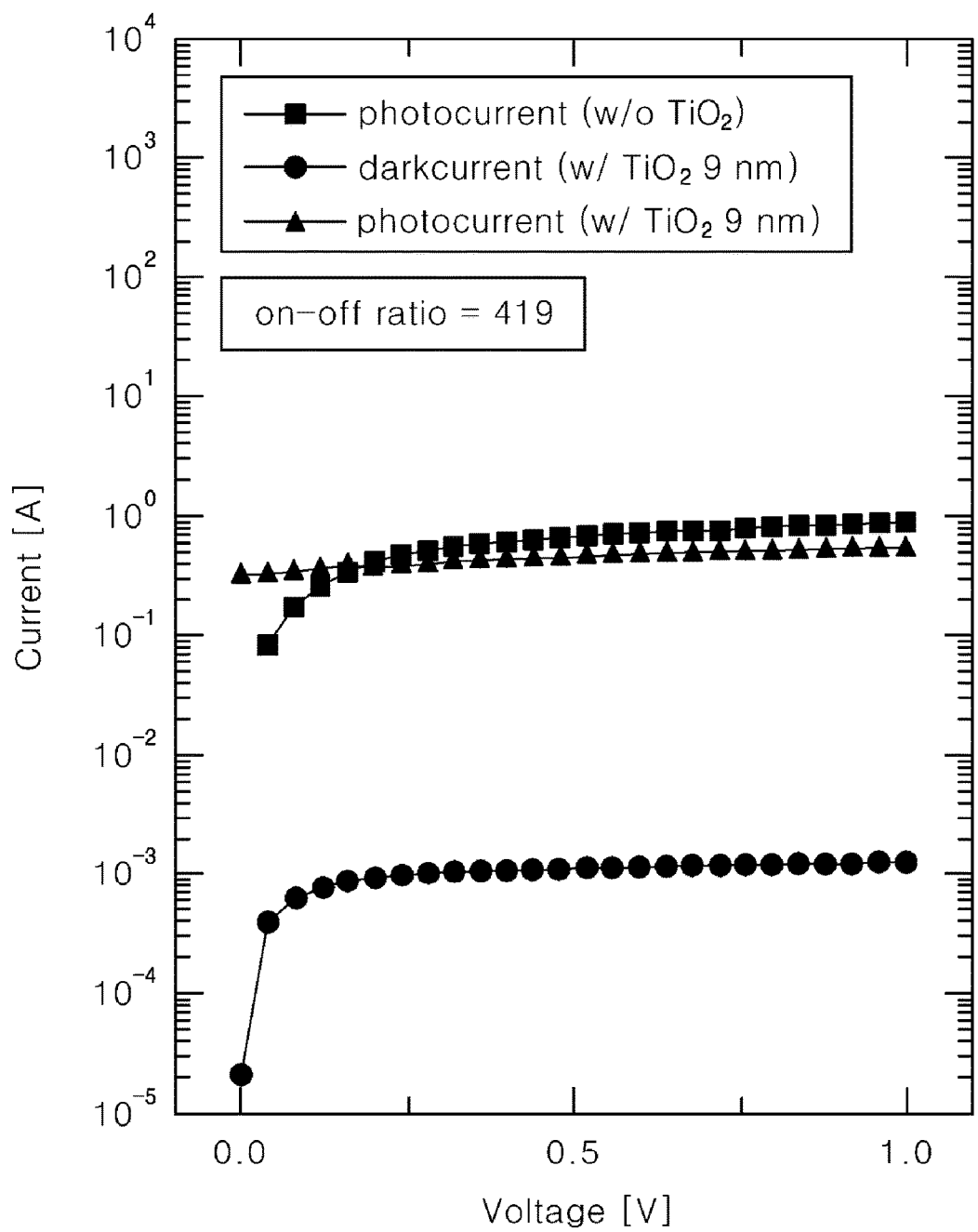

FIG. 18 shows characteristics of the dark current and the photocurrent for a structure in which the interlayer has thickness of 5 nm. FIG. 19 shows characteristics of the dark current and the photocurrent for a structure in which the interlayer has thickness of 7 nm. FIG. 20 shows characteristics of the dark current and the photocurrent for a structure in which the interlayer has thickness of 9 nm.

As seen in FIG. 17, when no interlayer material is present, the dark current is relatively high, resulting in an on-off ratio of 1.04. FIG. 18 shows an embodiment in which a 5 nm thick layer of TiO$_2$ is present, resulting in a substantially reduced level of dark current. Although the photocurrent is also reduced at higher voltages compared to the embodiment of FIG. 17, the reduction in dark current is greater, so the on-off ratio is 8.67, which is improved compared to FIG. 17. Similarly, the embodiments of FIG. 19 and FIG. 20, which have interlayer thicknesses of 7 nm and 9 nm, respectively, have dark current reduction amounts that exceed the photocurrent reduction amounts, resulting in on-off ratios of 262 and 419, respectively. Therefore, embodiments of the present application are substantial improvements to conventional photodiode technology.

Figure 21:
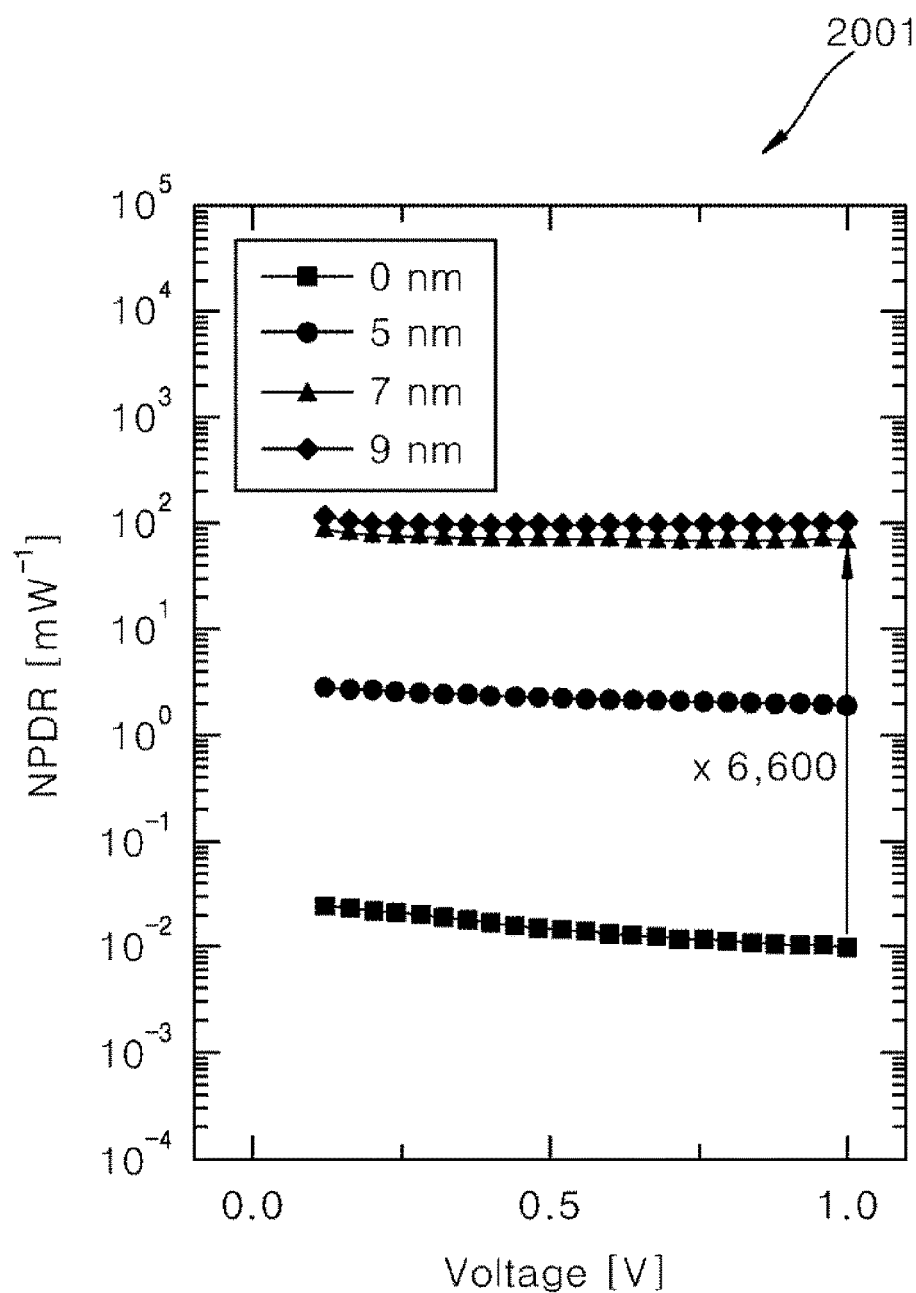
FIGS. 21 and 22 illustrate electrical characteristics of photodiodes according to embodiments of the present disclosure.
Figure 22:
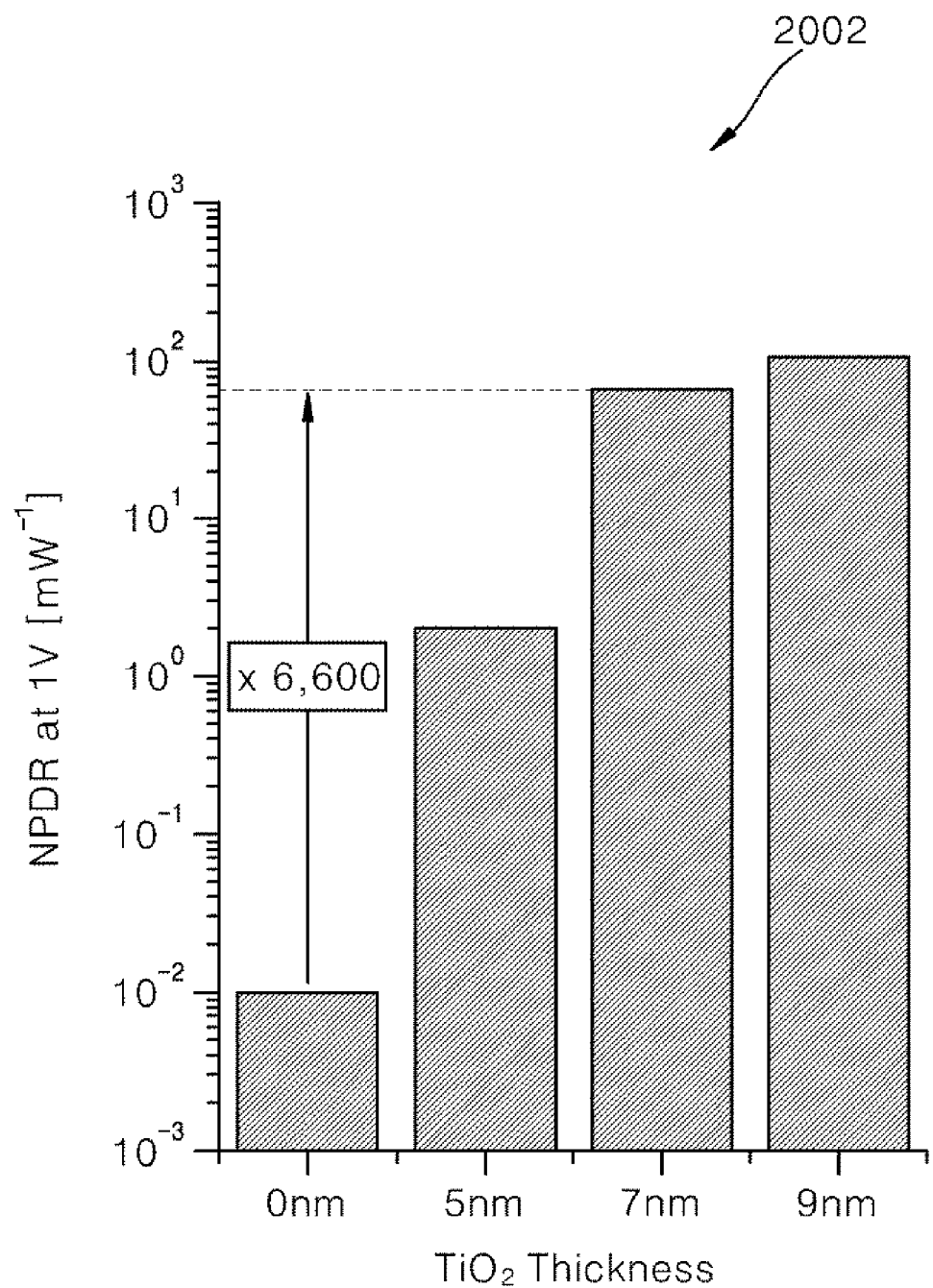

FIGS. 21 and 22 are graphs showing electrical characteristics of photodiodes according to embodiments of the present disclosure. The graphs of FIGS. 21 and 22 are obtained from embodiments in which the interlayer is formed of $TiO_2$. In FIG. 21, graph 2001 shows normalized photo-to-dark current ratios (NPDR) for various thicknesses of the interlayer. The graph 2002 of FIG. 22 shows NPDR based on interlayer thickness at 1V Graph 2002 shows that the NPDR of an embodiment in which a $TiO_2$ interlayer is present is about 6,600 times greater than the NPDR of an embodiment in which no interlayer material is present.

In accordance with one embodiment of the present disclosure, the electrode layers present in a cathode portion of the photodiode are different from the electrode layers present in an anode portion of the photodiode, thereby reducing dark current, resulting in increased performance of the photodiode.

A photodiode according to an embodiment of the present disclosure is an interdigitated photodetector that has different types of contact parts. When the contact parts protrude from the connection electrode part in an interdigitated structure, the interlayer may be disposed only in the contact parts, or fingers, of the cathode, and no interlayer may be disposed in the connection electrode portion of the cathode.

Embodiments of the present disclosure can reduce dark current by inserting an interlayer into portions of the electrode layer of the photodiode, preserving fabrication simplicity while improving photodiode performance.

As is apparent from the above description, a photodiode and the method for manufacturing the same according to embodiments of the present disclosure can reduce a dark current by asymmetrically constructing an electrode layer of a photodiode, resulting in increased photodiode performance.

A photodiode and the method for manufacturing the same according to an embodiment of the present disclosure can reduce a dark current by inserting an interlayer into some parts of an electrode layer of the photodiode, resulting in increased fabrication simplicity and increased performance of the photodiode.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:

1. A photodiode comprising:
   a semiconductor layer;
   a first contact part with an interlayer and at least one metal layer disposed in a first region of the semiconductor layer, the interlayer being disposed between the semiconductor layer and the at least one metal layer;
   a second contact part comprising at least one metal layer disposed directly on the semiconductor layer in a second region of the semiconductor layer; and
   an active region disposed between the first contact part and the second contact part,
   wherein the first contact part is a finger of a cathode electrode of an interdigitated photodiode, and the second contact part is a finger of an anode electrode of the interdigitated photodiode.

2. The photodiode of claim 1, wherein the first contact part is connected to a cathode, and the second contact part is connected to an anode.

3. The photodiode of claim 1, wherein the conduction band offset (CBO) between the semiconductor layer and the interlayer is less than 1.0 eV.

4. The photodiode of claim 1, wherein the CBO between the semiconductor layer and the interlayer is less than 0.1 eV.

5. The photodiode of claim 1, wherein the interlayer includes $TiO_2$.

6. The photodiode of claim 1, wherein the semiconductor layer includes germanium (Ge).

7. The photodiode of claim 1, further comprising:
   an interlayer dielectric film disposed over the semiconductor layer,
   wherein the interlayer dielectric film is etched in each of the first region and the second region.

8. A method for manufacturing a photodiode, comprising:
   depositing an interlayer dielectric film over a semiconductor layer;
   etching a first region in the interlayer dielectric film;
   depositing an interlayer material over the etched first region and the interlayer dielectric film;
   exposing the interlayer dielectric film by removing portions of the interlayer material disposed on the interlayer dielectric film;
   etching a second region separated from the first region in the interlayer dielectric film to expose the semiconductor layer;
   depositing a first metal layer over the interlayer material of the first region; and
   depositing a second metal layer over the exposed semiconductor layer of the second region,
   wherein the first contact part is a finger of a cathode electrode of an interdigitated photodiode, and the second contact part is a finger of an anode electrode of the interdigitated photodiode.

9. The method of claim 8, wherein a conductive band offset (CBO) between the interlayer material and the semiconductor layer is 1.0 eV or less.

10. The method of claim 8, wherein a conductive band offset (CBO) between the interlayer material and the semiconductor layer is 0.1 eV or less.

11. The method of claim 8, wherein the interlayer material includes $TiO_2$.

12. The method of claim 8, wherein:
    etching the first region includes wet-etching the first region; and
    etching the second region includes wet-etching the second region.

13. The method of claim 6, wherein exposing the interlayer dielectric film by removing portions of the interlayer material disposed on the interlayer dielectric film includes:
    dry-etching the interlayer material.

* * * * *